United States Patent
Li et al.

(10) Patent No.: US 10,003,042 B2
(45) Date of Patent: Jun. 19, 2018

(54) OLED DISPLAY DEVICE

(71) Applicant: Shenzhen China Star Optoelectronics Technology Co., Ltd., Shenzhen (CN)

(72) Inventors: Wenhui Li, Shenzhen (CN); Wen Shi, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 157 days.

(21) Appl. No.: 14/781,591

(22) PCT Filed: May 20, 2015

(86) PCT No.: PCT/CN2015/079380
§ 371 (c)(1),
(2) Date: Oct. 1, 2015

(87) PCT Pub. No.: WO2016/176876
PCT Pub. Date: Nov. 10, 2016

(65) Prior Publication Data
US 2017/0141347 A1    May 18, 2017

(30) Foreign Application Priority Data
May 4, 2015  (CN) .......................... 2015 1 0222560

(51) Int. Cl.
*H01L 29/08*        (2006.01)
*H01L 35/24*        (2006.01)
(Continued)

(52) U.S. Cl.
CPC ...... *H01L 51/5228* (2013.01); *H01L 27/3246* (2013.01); *H01L 51/0096* (2013.01); *H01L 51/525* (2013.01)

(58) Field of Classification Search
CPC ............ H01L 51/5228; H01L 27/3246; H01L 51/0096; H01L 51/525
See application file for complete search history.

(56) References Cited

U.S. PATENT DOCUMENTS

2010/0026167 A1*  2/2010  Park .................... H01L 27/3253
                                                    313/504
2012/0273804 A1*  11/2012  Hatano ................. H01L 51/525
                                                    257/79
(Continued)

FOREIGN PATENT DOCUMENTS

| CN | 101615624 A | 12/2009 |
| CN | 101728418 A | 6/2010 |
| KR | 20140119608 | * 9/2014 |

*Primary Examiner* — Joseph C Nicely
*Assistant Examiner* — Wilner Jean Baptiste
(74) *Attorney, Agent, or Firm* — Leong C. Lei

(57) ABSTRACT

The present invention provides an OLED display device, which includes an assisting conductive layer formed on a bottom surface of an upper substrate in such a way that the assisting conductive layer is in direct contact with and electrically connected to a second electrode that is located on a top surface of a lower substrate so that electrical conduction capability of the second electrode is enhanced and the electrical resistance of the second electrode is reduced to thereby make in-plane voltage homogenous, improve consistency of displaying, and alleviate the issues of non-uniform panel brightness and mura and also help reduce the thickness of the second electrode for saving material of the second electrode and increase light transparency of the second electrode.

5 Claims, 4 Drawing Sheets

(51) Int. Cl.
*H01L 51/00* (2006.01)
*H01L 51/52* (2006.01)
*H01L 27/32* (2006.01)

(56) References Cited

U.S. PATENT DOCUMENTS

2013/0234123 A1\* 9/2013 Hirakata ............. H01L 27/3211
                                                      257/40
2016/0071914 A1\* 3/2016 Lee ..................... H01L 27/3246
                                                      257/40

\* cited by examiner

OLED DISPLAY DEVICE

BACKGROUND OF THE INVENTION

1. Field of the Invention

The present invention relates to the field of flat panel displays, and in particular to an organic light emitting diode (OLED) display device.

2. The Related Arts

Active matrix flat panel display devices have various advantages, such as thin device body, low power consumption, and being free of radiation, and are thus widely used. Among them, an OLED (Organic Light Emitting Diode) is a flat panel displaying technique of extremely prosperous future and it shows excellent displaying performance and particularly possesses various advantages, such as being self-luminous, simple structure, being ultra thin, fast response, wide view angle, low power consumption, and being capable of achieving flexible displaying and is thus regarded as a "dream display". This, in combination with the factor that the facility expenditure is far less than that of thin-film transistor liquid crystal displays (TFT-LCDs), has attracted the attention of major display manufacturers and becomes the mainstream of the third-generation display devices of the field of displaying technology. It is now the time that mass production of the OLEDs is about to come true and advanced researches cause new techniques increasingly emerging. There will surely be a breakthrough process of the OLED displays.

As shown in FIG. 1, a conventional OLED display device comprises an upper substrate 200, a lower substrate 400, an enclosure resin frame 600 hermetically connecting between the upper substrate 200 and the lower substrate 400.

The lower substrate 400 comprises a first electrode 450 and a second electrode 480 that is located above the first electrode 450 and at a top of the lower substrate 400. The upper substrate 200 provides a sole function of serving as a package lid for isolation of moisture. The first electrodes 450 only functions as a pixel electrode (anode). The second electrode 480 (cathode) is generally thinner. Particularly, for a top-emitting OLED, the second electrode 450 must be made transparent and thus it must be even thinner to provide better light transparency. The thinner the second electrode 450 is, the greater the electrical resistance thereof would be. Thus, for a large-sized OLED display device, it is possible that there exists non-uniform in-plane voltage, affecting the homogeneity of displaying and causing undesired issues, such as non-uniform brightness and mura (which refers to a phenomenon of various tracing on a display due to inhomogeneous brightness).

SUMMARY OF THE INVENTION

An object of the present invention is to provide an organic light emitting diode (OLED) display device, which reduces the resistance of a second electrode, increases homogeneity of in-plane voltage, and improves issues of non-uniform panel brightness and mura.

To achieve the above objects, the present invention provides an OLED display device, which comprises an upper substrate, a lower substrate, and an enclosure resin frame hermetically connecting between the upper substrate and the lower substrate;

the upper substrate comprising a first base plate and an assisting conductive layer arranged on the first base plate;

the lower substrate comprising a second base plate, a thin-film transistor (TFT) layer arranged on the second base plate, a first insulation layer arranged on the TFT layer, a second insulation layer arranged on the first insulation layer, a first electrode arranged on the second insulation layer, a pixel definition layer arranged on the second insulation layer and the first electrode, an OLED light emission layer arranged on the first electrode, and a second electrode arranged on the pixel definition layer 46 and the OLED light emission layer; and the upper substrate being arranged above the lower substrate, a side of the upper substrate on which the assisting conductive layer is formed is arranged to face a side of the lower substrate on which the second electrode is formed, the assisting conductive layer and the second electrode being in direct contact with and electrically connected to each other.

The upper substrate further comprises a first photo spacer arranged on the first base plate, the assisting conductive layer being arranged on the first photo spacer and the first base plate and covering the first photo spacer, wherein a portion of the assisting conductive layer that covers the first photo spacer is in direct contact with the second electrode that is arranged on a top surface of the lower substrate so that electrical connection between the second electrode and the assisting conductive layer is established.

The lower substrate further comprises a second photo spacer arranged on the pixel definition layer, the second electrode being arranged on the second photo spacer, the pixel definition layer, and the OLED light emission layer and covering the second photo spacer, wherein a portion of the second electrode that covers the second photo spacer is in direct contact with the assisting conductive layer that is arranged on a bottom surface of the upper substrate so that electrical connection between the second electrode and the assisting conductive layer is established.

The upper substrate further comprises a first photo spacer arranged on the first base plate, the assisting conductive layer being arranged on the first photo spacer and the first base plate and covering the first photo spacer; the lower substrate further comprises a second photo spacer arranged on the pixel definition layer, the second electrode being arranged on the second photo spacer, the pixel definition layer, and the OLED light emission layer and covering the second photo spacer, wherein the first photo spacer of the upper substrate and the second photo spacer of the lower substrate are arranged to correspond to each other and a portion of the assisting conductive layer that covers the first photo spacer is in direct contact with a portion of the second electrode that covers the second photo spacer so that electrical connection between the second electrode and the assisting conductive layer is established.

The assisting conductive layer has a structure of an entire surface.

The assisting conductive layer has a continuous grating structure.

The assisting conductive layer is composed of multiple non-continuous parts.

The assisting conductive layer is a transparent conductive layer or an opaque conductive layer.

The assisting conductive layer is made of a material of indium tin oxide, indium gallium zinc oxide, tin oxide, copper, aluminum, chromium, titanium, or molybdenum.

In the lower substrate, the first insulation layer and the second insulation layer comprise a first via formed therein to correspond to the TFT layer, the first electrode being connected through the first via to the TFT layer; and the pixel definition layer comprises a second via formed therein to correspond to the first electrode, the OLED light emission layer being arranged in the second via.

The present invention also provides an OLED display device, which comprises an upper substrate, a lower substrate, and an enclosure resin frame hermetically connecting between the upper substrate and the lower substrate;

the upper substrate comprising a first base plate and an assisting conductive layer arranged on the first base plate;

the lower substrate comprising a second base plate, a TFT layer arranged on the second base plate, a first insulation layer arranged on the TFT layer, a second insulation layer arranged on the first insulation layer, a first electrode arranged on the second insulation layer, a pixel definition layer arranged on the second insulation layer and the first electrode, an OLED light emission layer arranged on the first electrode, and a second electrode arranged on the pixel definition layer 46 and the OLED light emission layer; and the upper substrate being arranged above the lower substrate, a side of the upper substrate on which the assisting conductive layer is formed is arranged to face a side of the lower substrate on which the second electrode is formed, the assisting conductive layer and the second electrode being in direct contact with and electrically connected to each other;

wherein the upper substrate further comprises a first photo spacer arranged on the first base plate, the assisting conductive layer being arranged on the first photo spacer and the first base plate and covering the first photo spacer, wherein a portion of the assisting conductive layer that covers the first photo spacer is in direct contact with the second electrode that is arranged on a top surface of the lower substrate so that electrical connection between the second electrode and the assisting conductive layer is established;

wherein the assisting conductive layer has a structure of an entire surface; and wherein in the lower substrate, the first insulation layer and the second insulation layer comprise a first via formed therein to correspond to the TFT layer, the first electrode being connected through the first via to the TFT layer; and the pixel definition layer comprises a second via formed therein to correspond to the first electrode, the OLED light emission layer being arranged in the second via.

The efficacy of the present invention is that the present invention provides an OLED display device, which comprises an assisting conductive layer formed on a bottom surface of an upper substrate in such a way that the assisting conductive layer is in direct contact with and electrically connected to a second electrode that is located on a top surface of a lower substrate so that electrical conduction capability of the second electrode is enhanced and the electrical resistance of the second electrode is reduced to thereby make in-plane voltage homogenous, improve consistency of displaying, and alleviate the issues of non-uniform panel brightness and mura and also help reduce the thickness of the second electrode for saving material of the second electrode and increase light transparency of the second electrode.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will become apparent from the following detailed description of an embodiment of the present invention, with reference to the attached drawings.

In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
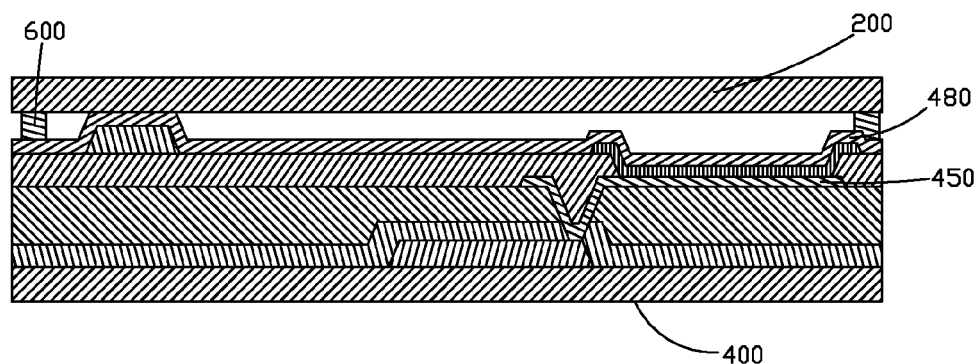
FIG. 1 is a schematic view showing a conventional OLED display device.
Figure 2:
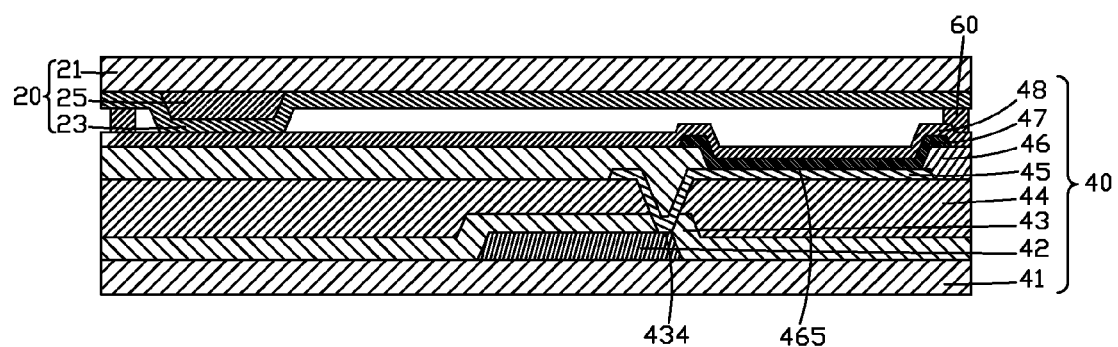
FIG. 2 is a schematic view illustrating an OLED display device according to a first embodiment of the present invention.
Figure 3:
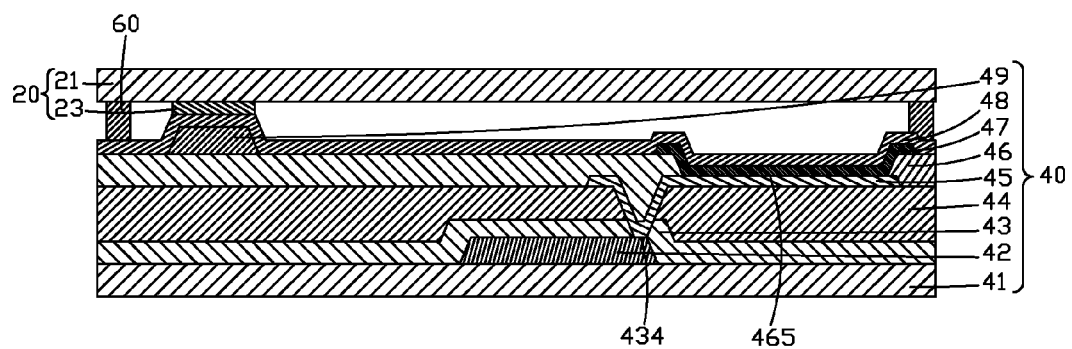
FIG. 3 is a schematic view illustrating an OLED display device according to a second embodiment of the present invention.
Figure 4:
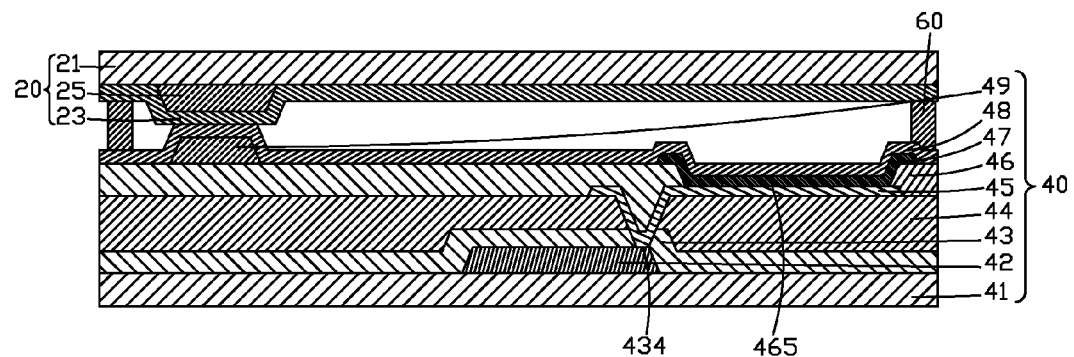
FIG. 4 is a schematic view illustrating an OLED display device according to a third embodiment of the present invention.

Referring to FIGS. 2-4, the present invention provides an organic light-emitting diode (OLED) display device, which comprises an upper substrate 20, a lower substrate 40, and an enclosure resin frame 60 hermetically connecting between the upper substrate 20 and the lower substrate 40.

The upper substrate 20 comprises a first base plate 21 and an assisting conductive layer 23 arranged on the first base plate 21.

The lower substrate 40 comprises a second base plate 41, a thin-film transistor (TFT) layer 42 arranged on the second base plate 41, a first insulation layer 43 arranged on the TFT layer 42, a second insulation layer 44 arranged on the first insulation layer 43, a first electrode 45 arranged on the second insulation layer 44, a pixel definition layer 46 arranged on the second insulation layer 44 and the first electrode 45, an OLED light emission layer 47 arranged on the first electrode 45, and a second electrode 48 arranged on the pixel definition layer 46 and the OLED light emission layer 47.

In the lower substrate 40, the first insulation layer 43 and the second insulation layer 44 comprise a first via 434 formed therein to correspond to the TFT layer 42. The first electrode 45 is connected, through the first via 434, to the TFT layer 42. The pixel definition layer 46 comprises a second via 465 formed therein to correspond to the first electrode 45 and the OLED light emission layer 47 is located in the second via 465.

The upper substrate 20 is arranged above the lower substrate 40. The side of the upper substrate 20 on which the assisting conductive layer 23 is formed is arranged to face the side of the lower substrate 40 on which the second electrode 48 is formed; and the assisting conductive layer 23 and the second electrode 48 are in direct contact with and electrically connected to each other.

Specifically, the first base plate 21 and the second base plate 41 can each be a glass plate, a plastic plate, or an aluminum plate. The first base plate 21 and the second base plate 41 can be of materials that are the same or different.

At least one of the first base plate 21 and the second base plate 41 is transparent.

Preferably, the first base plate 21 and the second base plate 41 are both glass plates.

The enclosure resin frame 60 comprises an ultraviolet (UV) curable resin.

Referring to FIG. 2, a first embodiment of the OLED display device according to the present invention is shown. In the instant embodiment, the upper substrate 20 further comprises a first photo spacer 25 arranged on the first base plate 21. The first photo spacer 25 is a protrusion formed on the first base plate 21 and is not electrically conductive. The assisting conductive layer 23 is arranged on the first photo spacer 25 and the first base plate 21 and covers the first photo spacer 25, wherein a portion of the assisting conductive layer 23 that covers the first photo spacer 25 is set in direct contact with the second electrode 48 that is arranged on a top surface of the lower substrate 40 so that electrical connection between the second electrode 48 and the assisting conductive layer 23 is achieved.

Referring to FIG. 3, a second embodiment of the OLED display device according to the present invention is shown. In the instant embodiment, the lower substrate 40 further comprises a second photo spacer 49 arranged on the pixel definition layer 46. The second photo spacer 49 is a protrusion formed on the first base plate 21 and is not electrically conductive. The second electrode 48 is arranged on the second photo spacer 49, the pixel definition layer 46, and the OLED light emission layer 47 and covers the second photo spacer 49, wherein a portion of the second electrode 48 that covers the second photo spacer 49 is set in direct contact with the assisting conductive layer 23 that is arranged on a bottom surface of the upper substrate 20 so that electrical connection between the second electrode 48 and the assisting conductive layer 23 is achieved.

Referring to FIG. 4, a third embodiment of the OLED display device according to the present invention is shown. In the instant embodiment, the upper substrate 20 further comprises a first photo spacer 25 arranged on the first base plate 21 and the assisting conductive layer 23 is arranged on the first photo spacer 25 and the first base plate 21 and covers the first photo spacer 25; the lower substrate 40 further comprises a second photo spacer 49 arranged on the pixel definition layer 46 and the second electrode 48 is arranged on the second photo spacer 49, the pixel definition layer 46, and the OLED light emission layer 47 and covers the second photo spacer 49, wherein the first photo spacer 25 of the upper substrate 20 and the second photo spacer 49 of the lower substrate 40 are arranged to correspond to each other and a portion of the assisting conductive layer 23 that covers the first photo spacer 25 is set in direct contact with a portion of the second electrode 48 that covers the second photo spacer 49 so that electrical connection between the second electrode 48 and the assisting conductive layer 23 is achieved.

In the above-described first to third embodiments, the first photo spacer 25 and the second photo spacer 49 can both be pillar like structures, such as cylindrical pillars or prismatic pillars.

Specifically, the first photo spacer 25 and the second photo spacer 49 are made of materials that can be organic resist or inorganic materials that are not electrically conductive. Preferably, the first photo spacer 25 and the second photo spacer 49 are made of materials that comprise organic resist. Making the first photo spacer 25 and the second photo spacer 49 with organic resist is a mature and easy process, allowing for mass production and requiring only one photolithographic operation, making the cost low.

The assisting conductive layer 23 can be a transparent conductive layer or an opaque conductive layer. Preferably, the assisting conductive layer 23 is a transparent conductive layer.

The assisting conductive layer 23 can be made of a material of indium tin oxide, indium gallium zinc oxide, tin oxide, copper, aluminum, chromium, titanium, or molybdenum.

Figure 5:
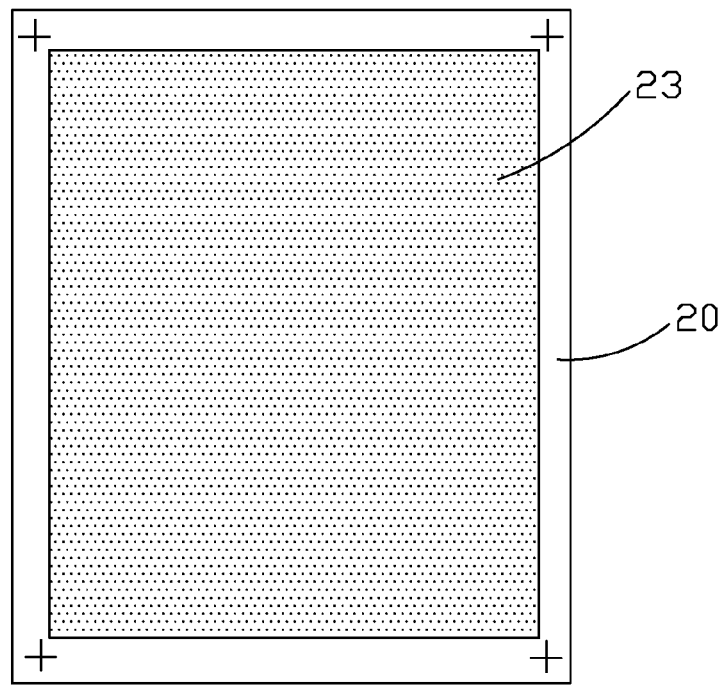
FIG. 5 is a schematic view illustrating a structure of an assisting conductive layer of the OLED display device according to the present invention.
Figure 6:
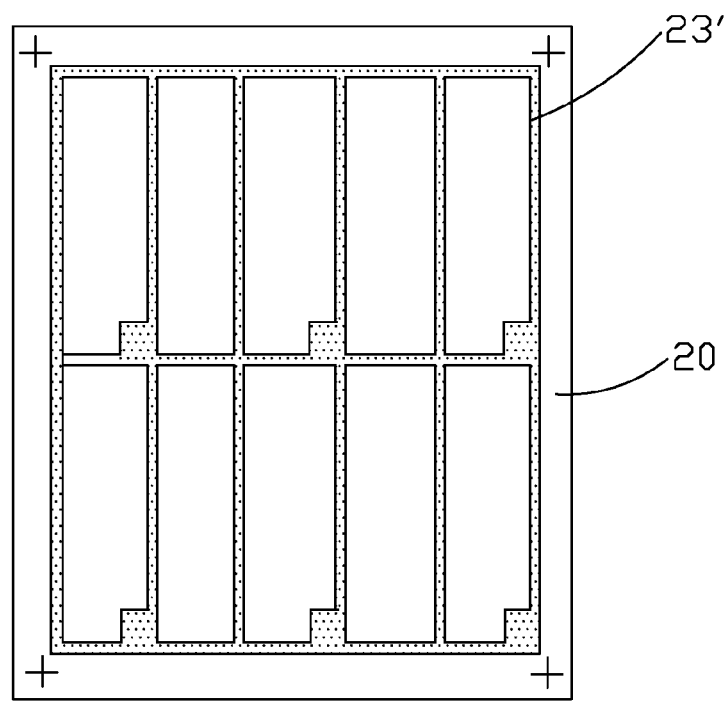
FIG. 6 is a schematic view illustrating another structure of an assisting conductive layer of the OLED display device according to the present invention.
Figure 7:
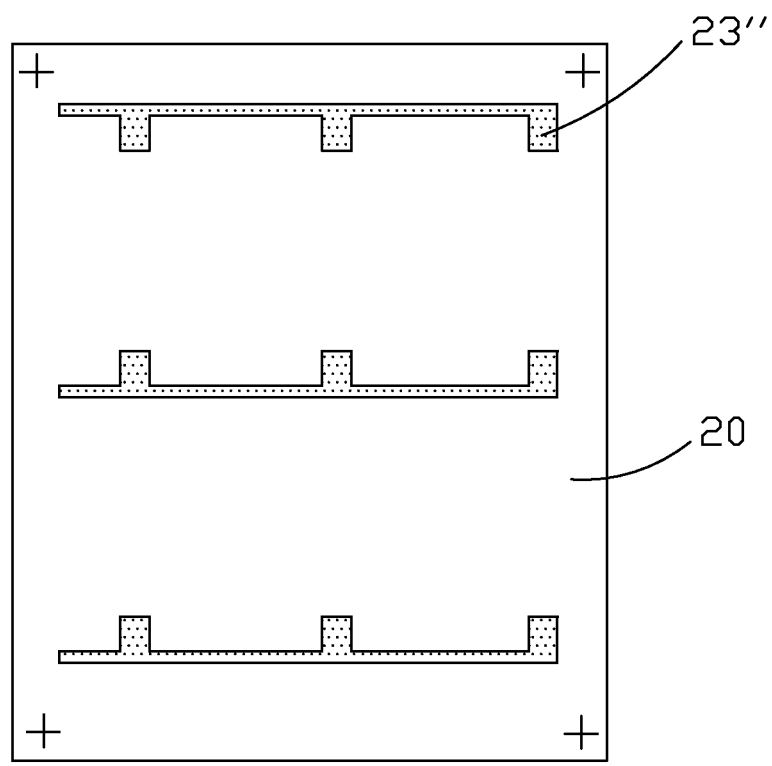
FIG. 7 is a schematic view illustrating a further structure of an assisting conductive layer of the OLED display device according to the present invention.

As shown in FIGS. 4-6, the assisting conductive layer 23/23'/23" can be of various shapes. As shown in FIG. 4, the assisting conductive layer 23 has a structure of an entire surface; as shown in FIG. 5, the assisting conductive layer 23' has a continuous grating structure; and as shown in FIG. 6, the assisting conductive layer 23" is composed of multiple non-continuous parts.

In summary, the present invention provides an OLED display device, which comprises an assisting conductive layer formed on a bottom surface of an upper substrate in such a way that the assisting conductive layer is in direct contact with and electrically connected to a second electrode that is located on a top surface of a lower substrate so that electrical conduction capability of the second electrode is enhanced and the electrical resistance of the second electrode is reduced to thereby make in-plane voltage homogenous, improve consistency of displaying, and alleviate the issues of non-uniform panel brightness and mura and also help reduce the thickness of the second electrode for saving material of the second electrode and increase light transparency of the second electrode.

Based on the description given above, those having ordinary skills of the art may easily contemplate various changes and modifications of the technical solution and technical ideas of the present invention and all these changes and modifications are considered within the protection scope of right for the present invention.

What is claimed is:

1. An organic light-emitting diode (OLED) display device, comprising an upper substrate, a lower substrate, and an enclosure resin frame hermetically connecting between the upper substrate and the lower substrate;
    the upper substrate comprising a first base plate and an assisting conductive layer arranged on the first base plate;
    the lower substrate comprising a second base plate, a thin-film transistor (TFT) layer arranged on the second base plate, a first insulation layer arranged on the TFT layer, a second insulation layer arranged on the first insulation layer, a first electrode arranged on the second insulation layer, a pixel definition layer arranged on the second insulation layer and the first electrode, an OLED light emission layer arranged on the first electrode, and a second electrode arranged on the pixel definition layer and the OLED light emission layer; and
    the upper substrate being arranged above the lower substrate, a side of the upper substrate on which the assisting conductive layer is formed is arranged to face a side of the lower substrate on which the second electrode is formed, the assisting conductive layer and the second electrode being in direct contact with and electrically connected to each other;

wherein the second electrode comprises a portion that is distant from the first electrode and is raised in a direction away from the pixel definition layer and toward the assisting conductive layer arranged on the first base plate so as to electrically connect with the assisting conductive layer.

2. The OLED display device as claimed in claim 1, wherein the upper substrate further comprises a first photo spacer arranged on the first base plate, the assisting conductive layer being arranged on the first photo spacer and the first base plate and covering the first photo spacer, wherein a portion of the assisting conductive layer that covers the first photo spacer is in direct contact with the second electrode that is arranged on a top surface of the lower substrate so that electrical connection between the second electrode and the assisting conductive layer is established.

3. The OLED display device as claimed in claim 1, wherein the lower substrate further comprises a second photo spacer arranged on the pixel definition layer, the second electrode being arranged on the second photo spacer, the pixel definition layer, and the OLED light emission layer and covering the second photo spacer, wherein the portion of the second electrode covers the second photo spacer and is in direct contact with the second photo spacer to be raised by the second photo spacer in the direction toward the assisting conductive layer that is arranged on a bottom surface of the upper substrate so that the portion of the second electrode electrically connects with the assisting conductive layer.

4. The OLED display device as claimed in claim 1, wherein the upper substrate further comprises a first photo spacer arranged on the first base plate, the assisting conductive layer being arranged on the first photo spacer and the first base plate and covering the first photo spacer; the lower substrate further comprises a second photo spacer arranged on the pixel definition layer, the second electrode being arranged on the second photo spacer, the pixel definition layer, and the OLED light emission layer and covering the second photo spacer, wherein the first photo spacer of the upper substrate and the second photo spacer of the lower substrate are arranged to correspond to each other and a portion of the assisting conductive layer that covers the first photo spacer is in direct contact with the portion of the second electrode that covers the second photo spacer and is in direct contact with the second photo spacer and is thus raised by the second photo spacer in the direction toward the assisting conductive layer so that the portion of the second electrode electrically connects with the portion of the assisting conductive layer corresponding thereto.

5. The OLED display device as claimed in claim 1, wherein in the lower substrate, the first insulation layer and the second insulation layer comprise a first via formed therein to correspond to the TFT layer, the first electrode being connected through the first via to the TFT layer; and the pixel definition layer comprises a second via formed therein to correspond to the first electrode, the OLED light emission layer being arranged in the second via.

* * * * *